US008562868B2

(12) United States Patent  
Kumta et al.

(10) Patent No.: US 8,562,868 B2  
(45) Date of Patent: Oct. 22, 2013

(54) TERNARY METAL TRANSITION METAL NON-OXIDE NANO-PARTICLES, METHODS AND APPLICATIONS THEREOF

(75) Inventors: Prashant Nagesh Kumta, Pittsburgh, PA (US); Amit Paul, Pittsburgh, PA (US); Prashanth Hanumantha Jampani, Pittsburgh, PA (US)

(73) Assignee: University of Pittsburgh—Of the Commonwealth System of Higher Education, Pittsburgh, PA (US)

( * ) Notice: Subject to any disclaimer, the term of this patent is extended or adjusted under 35 U.S.C. 154(b) by 329 days.

(21) Appl. No.: 12/473,802

(22) Filed: May 28, 2009

(65) Prior Publication Data

US 2010/0019207 A1    Jan. 28, 2010

Related U.S. Application Data

(60) Provisional application No. 61/056,726, filed on May 28, 2008.

(51) Int. Cl.
*H01B 1/06* (2006.01)

(52) U.S. Cl.
USPC ............ 252/506; 252/520.4; 148/304; 257/9; 257/306; 257/755; 428/323; 428/614; 428/702; 977/742

(58) Field of Classification Search
USPC ............ 252/506, 520.4; 148/304; 257/9, 306, 257/755; 428/614, 323, 702; 977/742
See application file for complete search history.

(56) References Cited

U.S. PATENT DOCUMENTS

| 4,650,722 | A  | * | 3/1987  | Brown et al. ................ 428/614 |
| 4,707,723 | A  | * | 11/1987 | Okamoto et al. ............ 257/755 |
| 5,433,797 | A  | * | 7/1995  | Erb et al. .................... 148/304 |
| 6,184,550 | B1 | * | 2/2001  | Van Buskirk et al. ....... 257/306 |
| 2005/0136292 | A1 | * | 6/2005 | Mariani et al. .............. 428/702 |
| 2006/0029792 | A1 | * | 2/2006 | Chen et al. .................. 428/323 |
| 2007/0138459 | A1 | * | 6/2007 | Wong et al. .................... 257/9 |

* cited by examiner

*Primary Examiner* — Khanh Tuan Nguyen
(74) *Attorney, Agent, or Firm* — Eckert Seamans Cherin & Mellott, LLC; Carol A. Marmo

(57) ABSTRACT

The present invention is related to ternary metal transition metal non-oxide nano-particle compositions, methods for preparing the nano-particles, and applications relating in particular to the use of said nano-particles in dispersions, electrodes and capacitors. The nano-particle compositions of the present invention can include a precursor which includes at least one material selected from the group consisting of alkoxides, carboxylates and halides of transition metals, the material including transition metal(s) selected from the group consisting of vanadium, niobium, tantalum, tungsten and molybdenum.

6 Claims, 2 Drawing Sheets

TERNARY METAL TRANSITION METAL NON-OXIDE NANO-PARTICLES, METHODS AND APPLICATIONS THEREOF

CROSS-REFERENCE TO RELATED APPLICATION

The present application is a traditional application of U.S. Provisional Patent Application Ser. No. 61/056,726, filed May 28, 2008, and entitled "Ternary Mixed Metal Transition Metal Non-Oxide Nano-Particles, Methods and Applications Thereof," which is herein incorporated by reference in its entirety.

BACKGROUND OF THE INVENTION

1. Field of the Invention

The present invention relates to ternary metal transition metal non-oxide nano-particles, methods for preparing the nano-particles and applications relating, in particular, to the use of said nano-particles in dispersions, electrodes, rechargeable batteries and capacitors.

2. Background of the Invention

Transition metal based non-oxide materials such as transition metal nitrides ("TMN") are known in the art for their high-melting temperature (e.g., approximately 3000° C.), hardness (e.g., Hv=approximately 1800 to 2100 kg/mm$^2$), electronic conductivity, chemical inertness, abrasion and wear resistance. These characteristics have made them useful for abrasion-resistant applications, optical coatings, low-resistivity contacts and as diffusion barrier layers in the microelectronics industry, as well as catalysts in the petroleum industry. Transition metal materials, such as TMNs, have also been found to exhibit surface-induced electrochemical characteristics rendering them useful as electrodes in capacitors.

Electrodes are key elements in energy storage and conversion devices, including, for example, batteries, fuel cells and capacitors. Technological advances in the electronics industry have created a substantial and on-going need to reduce electrode volume and weight to attain increased electrical and electrochemical energy and power densities. In the case of batteries and fuel cells, electrical and electrochemical energy storage and peak power generally relate to the available surface area of the electrode; thus, increasing the stored energy and peak power without increasing the weight and volume of the electrodes can be accomplished by increasing the surface area of the electrodes. In the case of capacitors, typically two mechanisms are found to be most common. First, there is what is known as the electrochemical double layer capacitors ("EDLC"), where the charge storage is primarily dependent on the surface area of the electrode. Second, there is a type of capacitor which is a pseudo-capacitor, whereby the charge storage is driven more by the Faradaic electrochemical charge transfer related to distinct oxidation and reduction reactions. In recent years, a third type of capacitor response has received much attention due to the ability to generate nano-structured forms of the electrode materials providing a combined influence of surface and electrochemical related charge storage mechanisms. This combined effect has led to these capacitors being referred to by the term "super-capacitors."

Electrical energy is stored in a capacitor, and super-capacitors are a relatively new type of electrical charge storage condenser as outlined above. Electrochemcial capacitors are useful for providing a rapid supply of a large quantity of electricity over a short period of time. Super-capacitors are characterized by orders of magnitude higher power densities, as compared to batteries; although, the energy densities are significantly lower. Super-capacitors are, thus, emerging as energy storage systems that could potentially change the direction of power electronics since compact electronic components with very large capacitances could be manufactured. Some of the important applications of super-capacitors include high-power devices for energy storage systems, voltage stabilizers, power failure protection and memory back-up for computers, displays and video-recorders. Further, applications comprising a hybrid arrangement with an energy storage capacitor for handling the peak power and a battery for handling the sustained load can also be envisioned.

Preferred materials for use in capacitors include noble metal oxides, such as $RuO_2$ and carbon. However, transition metal materials, such as TMNs, are good electronic conductors and offer the potential to exhibit high gravimetric and volumetric capacitance due to their large molar densities. Furthermore, Ru is expensive and its reserves are limited. As for carbon, although the raw materials are cheap, significant improvements will be needed to increase the volumetric power density using economic approaches. Thus, there is a need for exploring new systems that can display superior capacitance with good cycling stability and voltage response time.

SUMMARY OF THE INVENTION

The present invention relates to a ternary mixed metal transition metal non-oxide nano-particle composition including a precursor which includes at least one material selected from the group consisting of alkoxides, carboxylates and halides of transition metals, the material comprising at least two different transition metals selected from the group consisting of vanadium, niobium, tungsten, tantalum and molybdenum.

Another aspect of the present invention relates to a method of preparing a ternary mixed metal transition metal non-oxide nano-particle. The method includes reacting at least one material selected from the group consisting of alkoxides, carboxylates and halides of transition metals, the material comprising at least two different transition metals selected from the group consisting of vanadium, niobium, tungsten, tantalum and molybdenum, with a nitrogen-containing reagent in a solvent, to form a precursor and heat treating the precursor in a nitrogen-containing atmosphere.

Another aspect of the present invention relates to a dispersion which includes carbon nanotubes and ternary mixed metal transition metal non-oxide nano-particles, the nano-particles including at least one material selected from the group consisting of alkoxides, carboxylates and halides of transition metals, the material comprising at least two different transition metals selected from the group consisting of vanadium, niobium, tungsten, tantalum and molybdenum. In an embodiment, the carbon nanotubes can include single and/or multi-wall carbon nanotubes.

Still, another aspect of the present invention relates to a dispersion which includes preparing ternary mixed metal transition metal non-oxide nano-particles, the nano-particles including at least one material selected from the group consisting of alkoxides, carboxylates and halides of transition metals, the material comprising at least two different transition metals selected from the group consisting of vanadium, niobium, tungsten, tantalum and molybdenum; dispersing the nano-particles in a non-aqueous solvent; homogenizing the dispersion using a sonicator and admixing carbon nanotubes into the homogenized dispersion.

Furthermore, the present invention relates an electrode including the ternary mixed metal transition metal non-oxide material of the present invention, as well as a capacitor containing the electrode as an element thereof.

In still another aspect, the present invention relates to a rechargeable battery including a ternary metal transition metal non-oxide nano-particle composition including a precursor which includes at least one material selected from the group consisting of alkoxides, carboxylates, and halides of transition metals, the material including at least one transition metal selected from the group consisting of vanadium, niobium, tungsten, tantalum and molybdenum, wherein the rechargeable battery has an energy density of greater than 300 Wh/kg.

These and other objects of the present invention will be more fully understood from the following detailed description of the invention and reference to the illustration appended hereto.

DETAILED DESCRIPTION OF THE INVENTION

Figure 1:
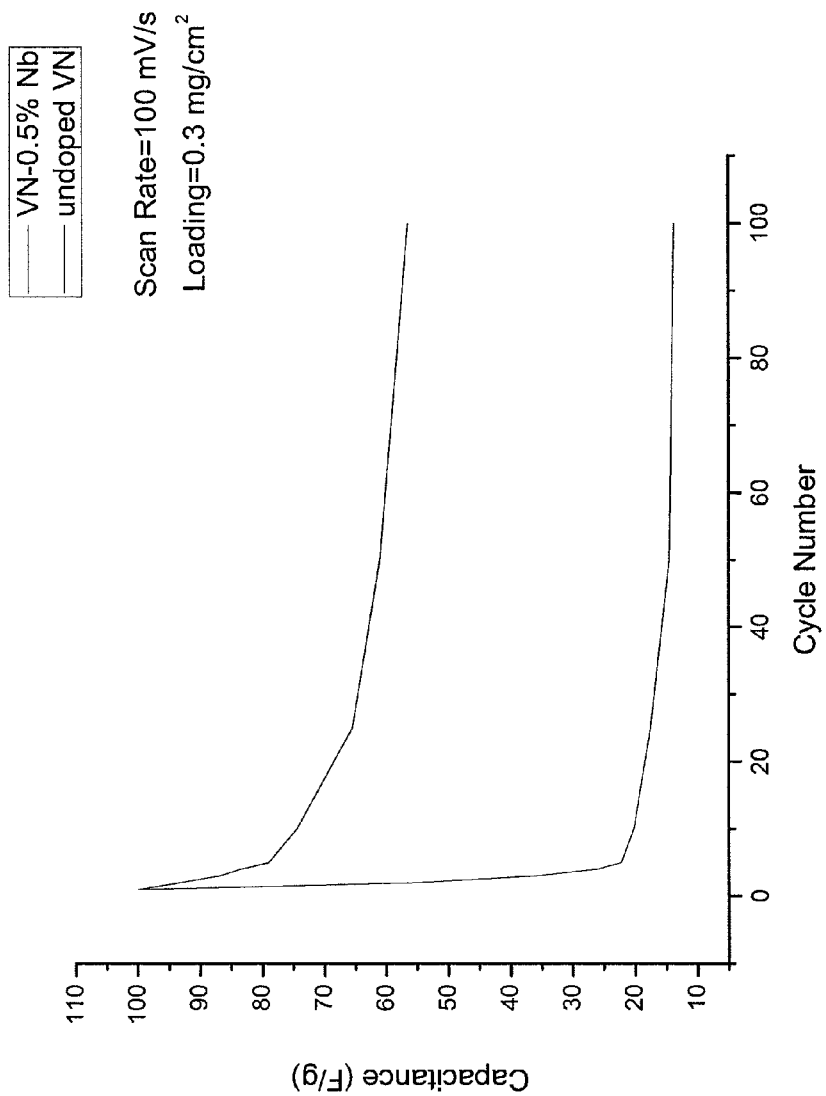
FIG. 1 is a plot of specific capacitance versus cycle number for electrochemical cycling of vanadium-carbon nanotube composite.
Figure 1A:
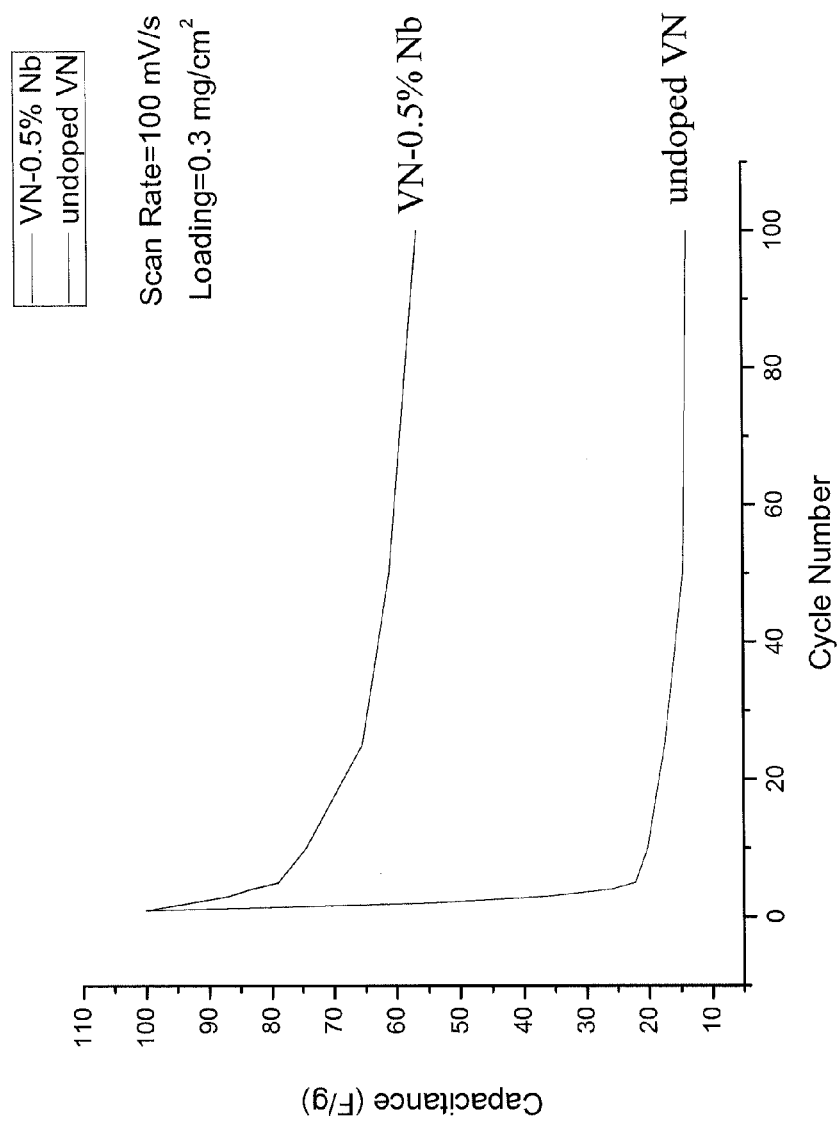

The present invention relates to ternary metal transition metal non-oxide nano-particle compositions which include at least one material selected from the group consisting of alkoxides, carboxylates, and halides of transition metals, the material including transition metal(s) selected from the group consisting of vanadium, niobium, tungsten, tantalum and molybdenum. In the embodiment wherein more than one transition metal is present (e.g., at least two different transition metals), the resultant composition can be referred to as a ternary "mixed" metal transition metal non-oxide nano-particle composition.

Suitable alkoxides for use in the present invention can include any of those known in the art such as but not limited to methoxides, ethoxides, propoxides, iso-propoxides, butoxides, hexoxides and mixtures thereof.

Suitable carboxylates for use in the present invention can include any of those known in the art such as but not limited to acetates.

Suitable halides for use in the present invention can include any of those known in the art such as but not limited to chlorides, iodides, bromides, flourides and mixtures thereof.

The ternary metal transition metal non-oxide nano-particle composition of the present invention can include at least one material selected from the group consisting of alkoxides, carboxylates and halides of transition metals. In an aspect of the invention, the composition can include two or more materials selected from the group consisting of alkoxides, carboxylates and halides of transition metals. The two or more materials can include two alkoxides, or two carboxylates, or two halides, or any combination thereof. Such combinations can include but are not limited to at least one alkoxide and at least one carboxylate, or at least one carboxylate and at least one halide, or at least one alkoxide and at least one halide, or at least one each of alkoxide, carboxylate and halide.

In the ternary mixed metal transition metal non-oxide nano-particle composition of the present invention, at least one material including alkoxide and/or carboxylate and/or halide of transition metals can include at least two different transition metals selected from vanadium, niobium, tungsten, tantalum and molybdenum. In a further embodiment, at least one transition metal is vanadium and at least one other transition metal is selected from the group consisting of niobium, tungsten, tantalum and molybdenum.

In an aspect of the present invention, the ternary mixed metal transition metal non-oxide nano-particle composition is prepared by reacting the material including an alkoxide and/or a carboxylate and/or a halide of a transition metal, having at least two different transition metals, with a nitrogen-containing reagent. The nitrogen-containing reagent can include, but is not limited to, an amine-containing reagent, ammonia ($NH_3$), anhydrous hydrazine ($N_2H_4$), alkyl hydrazines or a mixture thereof. This reaction can be carried out in the presence of a solvent. Any suitable solvent, known in the art can be used. In an embodiment, the solvent is an anhydrous aprotic solvent such as methylene chloride, acetonitrile or mixtures thereof. The resultant reaction product is a nitride, carbide or carbo-nitride precursor material.

In an aspect of the present invention, the alkoxide, carboxylate or halide reagent can be substantially dissolved in an anhydrous solvent, such as acetonitrile, and then reacted with the nitrogen-containing reagent, such as, but not limited to, anhydrous ammonia and/or anhydrous hydrazine, to form the precursor.

The resultant precursor materials can vary widely depending on the reagents selected. In an embodiment, the precursors can include, but are not limited to, ethoxides of niobium, tri-isopropoxide oxide of vanadium and tri-n-propoxide oxide of vanadium.

The precursor material can include other additives, such as, but not limited to, polymeric and inorganic materials. For example, the precursor material can include a block copolymer, such as a di-functional block copolymer available from Sigma-Aldrich under the tradename Pluronic F-127.

In one embodiment, for example, where vanadium chloride is used, the vanadium chloride may be dissolved in a material, such as, but not limited to, anhydrous chloroform or anhydrous ethanol may be added to vanadium chloride, prior to the introduction of the nitrogen-containing reagent. Furthermore, a complexing agent may be added to the vanadium chloride. The complexing agent can be selected from a wide variety of materials known in the art including, but not limited to, amine, such as ethylene diamine, or materials containing bifunctional chelating groups such as hydroxyl and amine, such as, for example, ethanolamine or triethanolamine.

The precursor material is subjected to a heat treatment in a nitrogen-containing atmosphere. The heat treatment can include a temperature within the range of from 400° C. to 600° C. The nitrogen-containing atmosphere can include, but is not limited to, ammonia ("$NH_3$"), nitrogen ($N_2$) or a mixture of nitrogen ("$N_2$") and hydrogen ("$H_2$") gases, and mixtures thereof. It is believed that during this treatment, carbon and/or oxygen atoms are removed and replaced with nitrogen atoms to form a nanocrystalline material. In an embodiment, carbon can be removed if not eliminated from the material such that the reaction product is substantially carbon free. In an aspect of the invention, the nano-crystalline material includes a nitride or carbide or a carbo-nitride. After soaking at the desired temperature of from 400° C. to 600° C., the nano-particles are chemically passivated by chemically converting the nitride on the surface, and preferably only the nitride on the surface, to an oxide or an oxynitride by reacting it in a controlled environment containing a mixture of inert gas and oxidizing agents. Suitable oxidizing agents can include those that are known in the art such as, but not limited to, oxygen, water, nitrogen oxides and carbon oxides. In an embodiment, 0.1% oxygen gas is used as the oxidizing agent.

For illustration purposes only, an aspect of the invention including preparation of a ternary mixed metal transition metal non-oxide nitride using mixed alkoxides of two different transition metals (e.g., vanadium and niobium) is described. The preparation procedure can be referred to as a hydrazide sol gel (HSG) process because, in general, the mixed alkoxides of transition metals are reacted in solution to form a gel of metal oxide material; the gel is then dried to produce a solid material, which in turn is reacted in a nitriding atmosphere to produce the nitride material. For example, the mixed alkoxides of transition metals are reacted with anhydrous hydrazine in anhydrous acetonitrile to form a precursor nitride. The alkoxides undergo nucleaphilic substitution with the hydrazine. The precursor is heat treated in $NH_3$ and/or $N_2$ to form the nitride. The ammonia and nitrogen atmosphere serve to convert the amorphous alkoxy-hydrazide precursor materials to their corresponding non-oxides, such as nitrides. Following heat treatment, the nitrides are passivated in an ultra high purity argon (Ar)-0.1% oxygen environment.

In another aspect of the present invention, the nitride, carbide and/or carbo-nitride material can be used to produce a dispersion. The dispersion includes the material and carbon nanotubes. The carbon nanotubes can be single or multiwall. Suitable carbon nanotubes for use in the present invention include those that are known in the art and prepared by conventional methods that are also known in the art. For instance, chemical vapor deposition ("CVD") is a method whereby suitable multi-wall carbon nanotubes can be produced. Various volume ratios and weight ratios of the carbon nanotubes and the nano-particles of the mixed metal transition metal non-oxide nitrides, carbides or carbo-nitrides, can be varied to achieve the desired high capacitance (e.g., 1370 F/g at scan rates of 100 mV/s and higher). In an embodiment, the ratio of carbon nanotubes to nano-particles can be from 1 weight percent to 15 weight percent. In another embodiment, the dispersion can include a non-aqueous solvent selected from a variety known in the art. Suitable non-aqueous solvents can include inert aprotic hydrocarbons, such as, but not limited to, toluene and/or xylene, N-methyl pyrrolidinone, acetonitrile and mixtures thereof. The ratio of nano-particles to solvent can be from 10 v/v to 100 v/v.

The dispersion is homogenized using a sonicator, and the carbon nanotubes are admixed into the homogenized dispersion. The sonication can be conducted at low energy, such as, but not limited to, a range of from 10 to 60 watts, or 20 to 30 watts, or preferably, 20 watts. The low-energy sonication minimizes or precludes degradation of the carbon nanotubes. The resultant dispersion can be substantially uniform. Further, the resultant dispersion can be dried using conventional drying techniques known in the art to remove the solvent.

The nitride, carbide and carbo-nitride nano-particles or dispersion containing said nano-particles of the present invention can be used to produce an electrode. The nano-particle material is deposited or formed on an electrically conductive support, such as a metal foil, mesh or the like. In an embodiment, the support is a nickel mesh. The nano-particle material can be directly deposited as a thin film or formed as a layer. The thin film or layer can be deposited or formed by using conventional techniques known in the art, such as, but not limited to, dip coating or spray deposition or slurry coating. The nano-particle material coating is then dried at an appropriate temperature to form the electrode.

The nano-particle material comprising the electrode has a thin oxide layer on the surface forming a passivation layer. The nano-particle nitride core (e.g., non-oxide) underlying the oxidized surface (e.g., the mixed metal core) provides the electrical conductivity property of the electrode. The nano-particle core material of the present invention can have an electrical conductivity of from $1 \times 10^6$ $\Omega^{-1}m^{-1}$ to $3 \times 10^6$ $\Omega^{-1}m^{-1}$. The oxidized surface (e.g., the mixed metal oxide) provides for charge storage. It is believed that a change in oxidation state results in a potentially-high charge storage. However, the metal oxide can be unstable such that it dissolves, and the charge storage is reduced. It is further believed that the mixed metal oxide of the present invention, wherein "mixed" refers to more than one transition metal being present in the metal oxide, is stable and resistant (e.g., in alkaline pH environments of pH 12), such that the tendency for the metal oxide to dissolve is reduced or minimized.

The mixed metal oxide film or layer is converted to a nitride or carbide or carbo-nitride by reacting it with a reductant as the temperature is increased. Suitable reductants can include, but are not limited to, ammonia, hydrazine, nitrogen, methyl amine, methane and ethane.

The thickness of the oxide film or layer can vary and can depend upon the desired capacitance. In an aspect of the invention, the thickness can range from 5 Angstroms to 10 Angstroms.

In an embodiment, the electrode of the present invention can have a capacitance of from 1300 F/g to 1400 F/g. Furthermore, the electrode can have a surface area of from 50 $m^2/g$ to 300 $m^2/g$.

In addition to the nano-particle material of the present invention, the electrode can include other conventional materials, such as carbon and a binder. Suitable binders can be selected from those known in the art, such as, but not limited to, poly-vinylidene fluoride ("PVDF"). In another embodiment, the nano-particle material can be utilized in the form of a powder, which optionally includes binder materials and the like. For example, the powder material can be a fine powder with a particle size of less than 25 microns, and the powder can be mixed with from 5% to 25% carbon (preferably acetylene carbon) and an inert binder material, such as a fluoropolymer.

In an aspect of the present invention, the electrode can be an element in a capacitor. The capacitor can be prepared in accordance with known methods, such as that described in Choi et al. in Advanced Materials, (2006), 18, pp. 1178-1182. The capacitor including the nano-particle of the present invention can demonstrate capacitance values of at least 1340 F/g at high scan rates of 100 mV/s.

Further, in an aspect of the present invention, as described in more detail in Example II herein, the nano-particle material of the present invention can be used to produce a rechargeable battery utilizing a lithium ion-containing salt in an organic solvent forming an ionic electrolyte. In one embodiment, the ternary metal transition metal non-oxide nano-particle composition of the present invention, including a precursor which includes at least one material selected from the group consisting of alkoxides, carboxylates, and halides of transition metals, the material including at least one transition metal selected from the group consisting of vanadium, niobium, tungsten, tantalum and molybdenum, is employed to produce a rechargeable battery. As a result, the battery can provide an increased voltage range for a supercapacitor which could result in an unexpected increase in energy density. The energy density for the rechargeable battery may be greater than 100 Wh/kg, or greater than 300 Wh/kg, or greater than 395 Wh/kg.

Not intending to be bound by any theory, it is believed that the nano-structured transition metal non-oxide nitrides, carbides and carbo-nitrides of the present invention can exhibit improved charge storage capability based on the following:
1. The ability of transition metals, such as vanadium, to undergo reduction and oxidation (redox) over a range of valence states, such as V(+5), V(+4), V(+3) and V(+2).

This change in oxidation states allows for the storage of charge corresponding to 3 electrons in a reversible manner. The change in oxidation state is afforded by a thin layer of oxide formed on the surface of the nitride, carbide or carbonitrides as previously described.

2. The high surface area afforded by the hydrazide sol gel process can provide charge storage due to the electrical double layer formation. The combined effect of the ability of the transition metal to exhibit several oxidation states and the electrical double layer phenomenon leads to the system displaying high capacitance.

3. The addition of other transition metals to generate a mixed metal transition metal nitride system will lead the generation of a chemically stable mixed oxide on the surface of the nitride, carbide and carbo-nitride. The formation of the mixed metal oxide combined with the high surface area afforded by the hydrazide sol gel process may result in a capacitor system exhibiting highly reversible capacitance.

4. The addition and incorporation of multi-wall and single-wall carbon nanotubes into the mixed metal transition metal non-oxide system can lead to the retention of very high capacitance at high scan rates.

Furthermore, it is believed that the present invention may exhibit at least one of the following benefits:

1. High chemical stability at pH of 1M KOH;
2. High capacitance values in the range of at least 1340 F/g at high scan rates of 100 mV/s;
3. Generation of nano-structured particles having a particle size in the range of 10 nm and smaller; and
4. High specific surface area in the range of from 100 to 300 $m^2/g$, or higher than 300 $m^2/g$.

Examples

It is believed that the evolution of nano-crystalline material derived from the precursor material of the present invention is dependent upon the reaction of the mixed alkoxides, carboxylates and halides of transition metals with a nitrogen-containing reagent, such as anhydrous hydrazine, amines and organic alkyl hydrazines, and the heat treatment conditions adopted for forming the nitride, carbide or carbo-nitride thereof. The mechanisms controlling the evolution of the nano-crystalline nitride microstructure, for instance, and the surface area will be further investigated in the following prophetic examples under the heading EXAMPLE I.

Example I

Experiments will be conducted to understand the mechanism responsible for achieving a nano-crystalline ternary nitride. It can be postulated as arising due to the presence of the amorphous oxynitride and/or oxide phases or the residual carbon from the unreplaced alkoxy groups. These phases could serve as "pinning" sites and prevent growth of the nitride. Additionally, the slow diffusion kinetics of the nitrogen atom could also promote retention of the nano-crystalline microstructure.

Experiments will also be conducted to investigate the fundamental mechanisms leading to high surface area ("HAS") formation. For instance, removal of carbon and oxygen during $N_2$ and $NH_3$ treatments may result in micropores leading to HSA. Nucleation and growth processes responsible for the evolution of nano-crystalline HSA microstructure from the amorphous precursor could thus be expected to be very different.

Compositional analysis of the microstructure and surface area at every stage of heat treatments will be conducted using conventional and high-resolution scanning and transmission electron microscopy ("HRTEM/HRSEM") coupled with electron energy loss spectroscopy ("EELS") and wavelength dispersive x-ray analysis ("WDS"). The surface area will be measured using $N_2$ adsorption and desorption in the Brunauer Emmett and Teller ("BET") method. It is believed that a step in the evolution of the nano-scale ternary nitride microstructure is in the presence of the amorphous oxynitride and/or oxide phases and the transformation to nitride in the presence of carbon with release of $CO_x$ and $H_2O$. It may be expected that there are vast differences in reactivity of these phases in $N_2$ and $NH_3$ thereby affecting the nucleation and growth mechanisms of the nitride in the two environments. For example, work performed has shown that the surface area of the precursor increases from 10 $m^2/g$ at 600° C. to 120 $m^2/g$ at 1000° C. in $NH_3$ while increasing to 250 $m^2/g$ in $N_2$ at 1000° C. Thus, changes in distribution of the amorphous phases, their composition and the particle sizes may be expected to be different in the two atmospheres, particularly, with control of the space velocity (flow rate/molar mass). This may directly affect the rate of transformation and consequently, the nitride microstructure and surface area. Thus, the rate of transformation of the precursor will be investigated by conducting a systematic, quantitative analysis of evolved gases at different temperatures during post-treatment of the precursors in $N_2$ and $NH_3$. Quantitative analysis of the evolved gases will be conducted using gas chromatography ("GC") and mass spectroscopy ("MS") after initially analyzing them qualitatively using Fourier transform infrared spectroscopy ("FTIR"). Detailed high resolution transmission electron microscopy ("HRTEM") analyses will be conducted between 25° C. and 600° C. and beyond to identify the nucleation and growth of the nitride while using electron energy loss spectroscopy ("EELS") and wavelength dispersive x-ray analysis ("WDS") to analyze the changes in composition of the amorphous phase(s). This will provide for determining the growth of the ternary nitride and ascertaining the changes in composition and particle sizes of the amorphous phase(s). The experiments will provide information on the grain structure, orientation, grain boundary structure, composition of the crystalline particles at the nucleation stage and also the mechanism of their growth. Furthermore, it is expected to provide insight into the interface structure of the amorphous and the nucleating nitride phase.

Work performed suggests a strong influence of composition, surface structure and morphology on supercapacitor response. It is believed that HSA ternary nitrides of niobium ("Nb") and vanadium ("V") will likely result in high values of capacitance due to the multiple oxidation states of Nb and V and their chemical stability in alkaline pH. It is proposed to systematically identify the electro-sorbed species and determine the surface reactions while studying the influence of the nitride microstructure on the capacitance. Detailed measurements of specific capacitance, surface charge density and its relation to the presence of surface active sites will be determined for nitrides exhibiting different surface area, microstructure and surface compositions. The experiments will provide a fundamental understanding of the optimum particle size, surface area and composition on the electrochemical stability while also identifying occurrence of cycling induced irreversible capacitance loss. Additionally, analysis will be conducted to observe changes in the microstructure and chemical composition of nitrides before and after cycling. It is expected that electrochemical surface oxidation and reduction of transition metal (TM) ions while maintaining the inner nitride core would likely occur in addition to the presence of surface active sites to contribute to the capacitance while preserving the electronic conductivity. These changes may affect the materials' composition and microstructure on cycling at various voltage ramp rates during cyclic voltammetry tests which will be analyzed using HRTEM and X-ray photoelectron spectroscopy (XPS).

A. Mechanism of Formation of Nanocrystalline Ternary Nitride Powders

1. Synthesis of Precursors using the Hydrazide Sol-Gel Process

Precursors will be synthesized based on the reaction of alkoxide with $N_2H_4$. Further, the reactions will be conducted in an anhydrous polar aprotic solvent such as acetonitrile (ACN) and/or methylene chloride. The precursors will be vacuum dried and characterized using FTIR (equipped with CsI optics) for presence of metal-nitrogen links such as Ti—N (1037 $cm^{-1}$) and Ti—O (450 $cm^{-1}$) linkages. These precursors will represent control or comparative samples. Similar procedures then will be followed for synthesizing ternary transition metal nitrides. Transition metal alkoxides will be dissolved in anhydrous ACN and then reacted with $N_2H_4$ to yield precursors. The precursors will be heat treated in $NH_3$ and/or $N_2$ to form nitrides. Ethoxides of Nb and tri-isopropoxide oxide and tri-n-propoxide oxide of V will be selected initially due to their reactivity, excellent solubility and low complexity in ACN. Alkoxy-hydrazide precursors containing various amounts of V and Nb will be synthesized following the above procedures.

2. Mechanism of Transformation of Alkoxy-Hydrazide Precursors to form Multi-Component Nitrides Work performed indicates that the precursors in the case of the TiN when heat-treated in both $N_2$ and $NH_3$ (75 p mol $s^{-1}$) using heating rates of 5° C./min to 1000° C. and 1° C./min thereon result in nano-crystalline TiN exhibiting surface areas of 250 $m^2/g$ and 120 $m^2/g$ respectively. This work is related to binary systems and will represent control or comparative samples. Similar precursors will be generated by reacting the alkoxides of V and Nb corresponding to different compositions of the ternary solid solution. The resultant precursors will be heat treated in $N_2$ and/or $NH_3$ using heating rates ranging from 0.10-15° C./min, in order to synthesize the ternary nitride powders with different particle sizes and surface areas. The flow rates of the reacting gases are also expected to affect the surface area and therefore low (70-100 µmol $s^{-1}$) and high flow (500-600 µmol $s^{-1}$) rate conditions will be selected. Differential thermal and thermogravimetric analyses ("DTA/TGA") will be conducted on the precursors using identical conditions to identify the thermal changes and phase transformation temperatures. The precursors then will be heat treated accordingly, and the evolved gases will be analyzed ("EGA") qualitatively using FTIR, while GC and MS will be employed to obtain quantitative information on the thermally induced changes. The procedure will be as follows:

i. Qualitative Fourier Transform Infrared Spectroscopy (FTIR)

Powders will be placed in a quartz boat and heated in a tube furnace under a constant $NH_3$ flow. Downstream from the furnace, the flow will be split and diluted with ultra high purity $N_2$ gas. The diluted gas then will pass through a mini gas cell (5 cm path length, containing ZnSe or NaCl windows) placed in a far (4000-200 $cm^{-1}$) infrared spectrometer, Mattson Galaxy Series FTIR 5000, equipped with a DTGS detector. The temperature of the entire line beyond the furnace including the gas cell will be kept at 110° C. using a temperature controlled heating tape to prevent condensation of the evolved gases. An initial background spectrum of $NH_3$ and $N_2$ used as heat treatment media will be collected. Spectra will be obtained at specific time intervals within a temperature range of from 25° C. to 1000° C. and the gases will be qualitatively identified based on their characteristic vibration modes (Table 1).

ii. Quantitative Gas Chromatography (GC) and Mass Spectroscopy (MS)

Approximately 100 µL gas samples will be extracted from the line downstream from the furnace (through a port sealed using a rubber septum). Gas chromatography (GC, Shimadzu) will be performed on the sample on a packed Hayesep DB and C column (Supelco Inc.) employing a thermal conductivity (TC) detector and helium (He) as the carrier gas. The various gases that could be anticipated to evolve and their retention times (in minutes) are as follows:

$CO_2$—16, $H_2O$–6.31, CO—3.5, $NH_3$—0.65 and organics approx. 7.

TABLE 1

Characteristic vibrations of gases expected to be evolved during heat treatment

| Molecule | Characteristic Vibrations ($cm^{-1}$) |
|---|---|
| $H_2O$ (gas) | 3567 (sym. stretch), 1595 (bending), 3756 (asym. stretch) |
| $NH_3$ (gas) | 3336 (sym. stretch), 932 (bending), 3414 (asym. stretch), 1628 (asym. bending) |
| $CO_2$ (gas) | 1343 (asym. stretch), 667 (bending), 2349 (asym. stretch) |
| Alcohols | 1150 to 1050 (C—OH stretching vibrations) |
| $N_2H_4$ (gas) | 3325 (stretch), 1493 (deformation), 1098 (rocking), 780 (wagging) |
| CO (gas) | 2143 (fundamental vibration) |

Alternatively, a six-way valve will also be used to directly extract a fixed volume of gas (≈100 µL) that will be carried to the column in a He stream. After feeding through the GC, the gases also will be fed into a MS (Finnigan) connected to the GC using a variable leak valve. The evolved gases (CO(m/e=28), $H_2O$ (m/e=18), $NH_3$ (m/e=17)) will be monitored on-line at each temperature.

It is expected that the use of FTIR, GC and MS will show the reactions involved in the formation of multicomponent nitrides. Evolved gas analysis in combination with thermal analyses will provide an indication of the range of temperatures at which the amorphous oxide and/or oxynitride phases form while also outlining a mechanism for their formation. Similarly, with the continued gas analyses at higher temperatures following the decomposition of $NH_3$, it will be possible to identify the mechanisms of transformation of the oxide and/or oxynitride and the alkoxy-hydrazide units to form the multi-component nitrides. In addition, quantitative GC-MS will also provide information on the rates of formation of the amorphous phase(s) and their transformation to the nitride. It is expected that these results will form the basis for understanding the evolution of the nano-structured and the high-surface area microstructure of the multi-component nitride powders. Further, spectroscopic studies of the evolved gases are expected to provide an understanding of the mechanism of transformation of the precursors to the nitrides. XRD, FTIR, TEM and thermal analyses will be used to evaluate the chemical structure and phase changes in the solid precursors during nitridation. These analyses will involve, for example, initially observing the variations in the peak intensities of the Ti—O (450 $cm^{-1}$) and Ti—N (1037 $cm^{-1}$) vibrations in the FTIR spectra of the solid product prior to the formation of single phase TiN. These data will be representative of control or comparative samples. Similar analysis will be conducted for the ternary nitrides of the present invention. This will indicate the formation, transformation and growth of the oxide and/or oxynitride and nitride phases. The analysis may be limited by the electronic conductivity of the solid with increasing nitrogen contents. Thus, XRD and TEM along with WDS and EELS will also be used to identify crystalline nitride and the amorphous oxide and/or oxynitride phases. Correlation of the EGA, DTA/TGA results along with TEM, XRD and FTIR analyses of the solid products may identify the exact stages of nucleation and growth of the multi-component nitrides.

B. Evolution of the Nanocrystalline Microstructure of Hydrazide Sol-Gel Derived Ternary Transition Metal Nitride Powders A study of the evolution of the ternary nitride microstructure will be conducted. The study will include a systematic analysis of the precursors during each stage of heat treatment using electron microscopy following EGA and thermal analyses. Different precursors from stage A will be subjected to SEM, TEM and XPS analysis as follows:

Step 1. Structural Investigation of the Hydrazide Sol-Gel Derived Amorphous Phase(s)

At temperatures below 600° C., EGA and thermal analyses results from stage A may identify the formation of amorphous phase(s) in $NH_3$ and $N_2$. The exact stage at which the phase(s) form may have an effect on the evolution of the nanocrystalline multi-component nitride microstructure. In order to identify this, the precursors at each stage of heat treatment from 25° C. to 600° C., as determined by the TGA-DTA analysis, will be observed under the TEM. Powders will be sonicated and floated on holey carbon grids. High resolution TEM and WDS will be used to observe and map the composition of the amorphous phase(s) while also observing the formation of the nitride and determining their size and distribution. The composition of the crystals and the amorphous phase(s) will be determined by WDS and EELS. The microscope to be used is equipped with state-of-the-art field emission TEM combined with a Gatan Energy Filter which will enable the identification of V, Nb, nitrogen, and oxygen. Field emission SEM and XPS analysis will also be conducted to observe the morphological changes and map the composition during heat treatment in the two environments.

Step 2. Structural Investigation of the Transformation of Amorphous Phase(s) to Yield Ternary Transition Metal Nitrides (TMNs)

The precursor powders will be observed under the TEM using similar procedures, as in Step 1 above, to observe the transformation of the amorphous phase(s) to yield the nitride. Work conducted shows that the precursors, when heat treated in $NH_3$ or $N_2$ at different temperatures, show differences in the amounts of the nitride and consequently, the amorphous phase(s) formed. It is likely, therefore, that the amorphous phase is richer in nitrogen content when heated in $NH_3$ at temperatures above 600° C. in comparison to the precursor heat treated in $N_2$. Work conducted also indicates that there is no significant change in the particle morphology when the precursor is heat treated in the two environments; although, there is a vast difference in the surface area. Thus, the rate of transformation of the amorphous phase to form the nitride impacts the evolution of the surface area and the nanocrystalline microstructure of the nitride. The evolution of the nanocrystalline microstructure will be investigated by observing the composition of the amorphous phase and the nitride-amorphous phase interface under high resolution TEM/HRTEM to observe the growth mechanisms responsible for the formation of the multi-component nitrides. High resolution studies will allow assessment of the formation of micropores and any nanocrystalline oxynitride and its orientational influence on the nucleation and growth of the multi-component nitride. It is likely that the structural nature of this interface and the kinetics of transformation of the amorphous phase will influence the evolution of the high surface area. Compositional maps will be obtained at each temperature using EELS and WDS analysis to analyze the variations in the elemental composition. It is expected that, from the results of these experiments, it will be possible to observe and identify the differences in the composition of the amorphous phase(s), the rates and the mechanisms of transformation to the nanocrystalline nitride in each of the precursors heat treated in the two different environments. Similarly, as in Step 1 the powder samples will be observed under the SEM and XPS to follow the morphological and compositional changes occurring in the powders. Results of EGA in stage A will be correlated with the TEM/HRTEM/EELS/WDS results in Stage B in order to ascertain the mechanisms involved in the evolution of the nano-crystalline microstructure and the surface area of the ternary nitride.

C. Electrochemical Characterization of Hydrazide Sol-Gel (HSG) Derived Nano-Crystallline Ternary Transition Metal Nitride Powders A combination of potentiostatic, galvanostatic and voltammetry techniques will be used to test the charge storage capability of the multi-component nitrides synthesized using the HSG process. Specifically, the cells will be tested to understand three different aspects: (a) to attain information on the capacitance, and the differential charge capacity i.e. (dq/dV, where q is the charge due to 12 electrosorption) as a function of the potential (V) generated at a constant current, (b) to obtain information on the potential of electrochemical stability and (c) to identify and study the charge and discharge reactions employing cyclic voltammetry ("CV"). These measurements will be performed using a standard three-electrode cell assembly in accordance with known procedures. The synthesized nitride material will be used to form a working electrode which will be prepared by mixing the powder with a conductivity enhancer (high surface area carbon) known in the art as Super P carbon and poly(vinylidene)fluoride ("PVDF") in N-methyl pyrrolidinone ("NMP") in a weight ration of 85:5:10 and then pressing the powder onto a Pt mesh or stainless steel mesh. The counter electrode will comprise a smooth Pt-wire. Stable counter electrodes such as Au will also be used if Pt is found to be unstable in the potential window of use. The potentials of both positive and negative electrodes will be measured against a Hg/HgO reference electrode using 1.0M KOH as the electrolyte. The initial potential range will be selected to be within the range of decomposition of water (−1.2 V and +0.0V). In this potential window, it may be possible that Pt could induce the decomposition of water as reported. Thus, other stable electrodes, such as Au, will also be used in this potential window region. Cyclic voltammetry will be conducted using a range of sweep rates (1 mV/s to 100 mV/s). These sweep rates will ensure the observation of any electrochemically-induced surface reactions during the anodic and cathodic processes. Constant current galvanostatic charge discharge profiles will also be obtained using constant currents of 1 mA/mg to as high as 70 mA/mg. It is expected that this data will provide information on the kinetics of the variation of the charge storage capacity, and thus, yield a measure of the energy density. The capacitance will be determined from the current and the sweep rate employed in the CV experiments (C=i/s, s=dV/dt, i=current and s=sweep rate). Similarly the charge 'q' and charge density 'q*' as a result of any electrochemical reaction will be obtained by integrating the ratio of j=i/A (A=area) and s over the test potential range. These studies will provide information relating to the reactions occurring at the surface of the electrodes. After each charge and discharge process, the electrodes will be analyzed using FTIR. and XPS to analyze the chemical composition on the surface of the particles, which should indicate the probable reactions occurring on the surface of the nitride particles, particularly the oxidation of the TM in the nitride to form stable oxide and/or oxynitride phases during charge and discharge cycles. Further, it will be possible to characterize the change in capacitance occurring for the different sweep rates employed and compare the responses of the ternary transition metal nitride exhibiting different microstructures and surface areas. Similar characterization will be conducted for all the ternary nitrides synthesized with varying metal and nitrogen contents. Proper correlation of the electrochemical results with electron microscopy (BRTEM/EELS) and XPS studies will provide information relating to the influence of microstructure (particle size, crystallite size, grain boundary, orientation) and oxidation states of the TM in the ternary nitrides on the electrosorption phenomena, capacitance and stability. Similarly, electronic conductivity of the ternary nitrides before and after electrochemical cycling will be measured on pressed pellets using a known four-point method. This will provide information about the degradation if any, due to cycling related dissolution of the TM. This will be followed by chemical analysis of the electrolyte for the TM ions using atomic absorption to analyze the electrochemical stability of the ternary nitrides during electrochemical cycling. Impedance spectroscopy will also be conducted at specific potentials in the 1 mHz-1 MHz frequency range to analyze the charge-transfer characteristics of the electrodes, as well as the equivalent series resistance modeling the response to suitable equivalent circuits. These analyses will be used to analyze the electrical, double-layer capacitance versus the pseudo-capacitance response. Similarly, it is expected that the result of the analysis will show the cycling-related microstructural changes and electrode polarization. The impedance results will also be correlated to the compositional and microstructural changes occurring during cycling under different voltage scan rates.

The following experiments, under the heading EXAMPLE II, were conducted in accordance with the present invention to produce a nano-crystalline mixed metal transition metal non-oxide nano-particles.

Example II

Powder Synthesis of Nanocrystalline Vanadium Nitride Powders by Wet Chemical Methods A. Ammonolysis of Vanadium Chloride Vanadium chloride (99+%, ACROS Organics) was dissolved in anhydrous chloroform (99.9%, extra dry, stabilized on molecular sieves, ACROS Organics) in an inert glove box atmosphere and allowed to homogenize for about an hour. The reaction vessel was then tightly shut off and removed to a fume hood. Chemical resistant quick disconnects (Colder Products Company) were used with hose cocks to preclude air from entering the vessel. The reaction vessel was then connected using quick disconnects to an anhydrous $NH_3$ gas flow (Research grade, Valley National Gas) at 100 cc/min such that there was no air contamination in the process. The ammonolysis reaction was allowed to proceed for 12 hours after which the solvent chloroform was distilled off at a temperature of 105° C. The reaction vessel was again transferred to a glove box and the powder intermediate was collected. Heat treatment of the powder was performed under anhydrous $NH_3$ flowing at 130 cc/min. The intermediate powder was kept under inert UHP—Ar in a glove bag (Atmosbag, Aldrich) while inserting it into a tube furnace in an alumina crucible. The heating rate and cooling rates during heat treatment were kept at 5° C./min and the powder was allowed to remain at the dwell temperature of 400° C. for 10 hours. Prior to removal of powder from the furnace, passivation was performed under 0.1% $O_2$—Ar atmosphere to prevent pyrolysis of the nano-powder upon exposure to air. The final product (VN-1) was then characterized as described in the following sections.

B. Hydrolysis of Vanadium Chloride and Subsequent Ammonolysis

In order to prepare high-surface area vanadium nitride powders, a facile polymer approach was used. The approach involved use of Pluronic F-127, a di-functional block copolymer. About 1 ml of vanadium chloride (Aldrich Chemicals) was added to a sealed reaction flask (attached to quick-connects as described above) and removed from a glove box. The flask was then connected to a UHP—Ar line in a fume hood and 5 ml of Anhydrous Ethanol (99.5+%, Sigma-Aldrich) was added drop-by-drop to the vanadium chloride with vigorous stirring. This was followed by addition of a well-mixed solution of 1 gm Pluronic F-127 (Sigma-Aldrich) in 6 ml Ethanol (ACS reagent). The turquoise sol thus formed was allowed to gel overnight on a hot plate at a temperature of 60° C. The gel was then transferred to an alumina crucible and either directly ammonolysed under anhydrous $NH_3$ (130 cc/min) for 10 hours at 450° C. (VN-2) or allowed to form vanadium oxide ($V_2O_5$-1) by calcination in air at 400° C. for 5 hours and then ammonolysed at 800° C. for 2 hours at a flow rate of 130 cc/min ($NH_3$) at a heating rate of 2° C./min (VN-3).

C. Chelation Synthesis

Vanadium nitride powders were also synthesized by a complexed precursor approach. In this approach, vanadium chloride (~2 grams) was added to a reaction flask in a glove box and transferred to a flowing UHP—Ar line as described above. Then, 100 ml of anhydrous acetonitrile was added drop-wise to act as the solvent and 3 ml of ethylene diamine was added to act as the complexing agent. The solution was stirred strongly for 10 minutes. Then, 100 ml of water was added to the mixture, and after 15 minutes of stirring, the solution was allowed to reflux at a temperature of from 95° C. to 100° C. for 6 hours in an oil bath. The solution was filtered and the powder formed was washed with water repeatedly. Afterward, the powder was dried in a vacuum oven overnight at 100° C. The intermediate dried powder was heat treated in anhydrous $NH_3$ gas at 120 ml/min. The heating program involved heating to 120° C. at a very rapid heating rate of 15° C./min and dwelling there for one hour before heading to a final temperature at a rate of 3° C./min. The sample was retained at the final temperature (400° C. (VN-5) or 725° C. (VN-6)) for 4 hours before cooling to room temperature.

D. Synthesis of Vanadium-Niobium Nitride (VN—NbN) and Vanadium-Tantalum Nitride (VN—TaN)

Vanadium-niobium nitride and vanadium-tantalum nitride were prepared in accordance with the procedure described in Section A herein (under EXAMPLE II) with the exception that, instead of dissolving only vanadium chloride in anhydrous chloroform, both vanadium chloride and niobium chloride were dissolved in the preparation of vanadium-niobium nitride, and both vanadium chloride and tantalum chloride were dissolved in the production of vanadium-tantalum nitride.

E. Materials Characterization

As synthesized, VN and doped VN powders (e.g., binary vanadium and ternary substituted vanadium nitride) were characterized by X-ray diffraction analysis on a Philips X'pert Pro instrument using Cu Kα radiation. Multipoint Brunauer-Emmett-Teller (BET) technique was performed on a Micromeritics ASAP-2020 unit to characterize the surface area of the samples.

F. Electrochemical Characterization

Cyclic voltammetry experiments were performed on a portion of the synthesized nitride materials to test their viability as high energy density supercapacitor materials. The process involved preparation of a slurry for coating onto the current collector substrate. The slurry composition consisted of 85% active nitride, 5% Super-P Carbon and 10% Poly Vinylidene Flouride (PVDF) (from Aldrich Chemicals) binder in a solution of N-Methyl Pyrollidine (NMP) (from Fisher Scientific). The PVDF was mixed in the NMP solvent such that 1 mg of PVDF was made up to 5 ml with NMP solution. The active material and Carbon were dispersed in this solution. Two types of cell setup were used to test materials.

1. Three-Electrode Half Cell

In this type of cell, an aqueous KOH solution of unit normality was used as the electrolyte. The active material based slurry, as described earlier, was coated on a nickel current collector shaped like a coin and was allowed to dry overnight in a vacuum oven. The active material weight was measured and the cell was assembled with a platinum counter electrode and Hg/HgO reference electrode. Cyclic voltammetry tests were performed on a Princeton Applied Research Versastat 3 potentiostat. Cycling was performed from −1.2 V to 0 V with respect to reference. In addition to the materials described in EXAMPLE II above, two other materials were also tested in this way. One of the materials multiwall Carbon Nanotubes ("CNT") synthesized in a Chemical Vapor Deposition setup was also tested in this setup. The second ("VN-CNT") consisted of a mixture of 90% VN-1 with 10% CNT dispersed together by sonication in methanol. Both CNT and VN-CNT slurries were prepared with a composition 90% Active material and 10% PVDF binder.

Another material, included low-purity, multiwall carbon nanotubes ("LPCNT") synthesized in a chemical vapor deposition setup. Still another material ("VN-LPCNT") included a mixture of 90% VN-1 with 10% CNT (by weight) dispersed together by sonication in methanol. Both CNT and VN-LPCNT slurries were prepared with a composition having 90% active material and 10% PVDF binder. Yet another material ("VN-HPCNT") was a 90-10 mixture (by weight) of VN-1 and high purity multiwall carbon nanotubes ("HPCNT"). This material was tested with a slurry composition of 85% active material, 5% Super-P Carbon and 10% PVDF in a solution of NMP.

2. Hockey-Puck Cell

In addition to the conventional three-electrode cell for supercapacitor testing, the nitride materials were also tested in a battery-like, hockey-puck cell. This was done to explore a larger voltage window for the supercapacitor which would increase energy density very rapidly. VN-1 was tested this way by coating a Cu-foil used in battery anodes with VN-1 slurry made as already described and allowing it to dry in a vacuum oven. Battery-like electrodes of 1 cm$^2$ were then punched and a hockey-puck cell consisting of the active material electrode as the working electrode, Lithium foil as counter electrode and Lithium foil as reference electrode was assembled in a glove box. The electrolyte used was LiPF$_6$ in Ethyl Carbonate: DiMethyl Carbonate (2:1) known to be electrochemically stable over a large voltage window. Two batteries (VN-battery-1 and VN-battery-2) were made and tested in different voltage windows.

TABLE 2

Specific Capacitances of the VN Materials

| Material | BET Surface area (m$^2$/g) | Loading (mg/cm$^2$) | Scan rate (mV/s) | Voltage window (V) | Reference electrode | Electrolyte | Capacitance (F/g) | Energy density (Wh/kg) |
|---|---|---|---|---|---|---|---|---|
| VN-1 | 28.46 | 0.644 | 10 | −1.2-0 | Hg/HgO | KOH (1N) | 114.73 | 22.95 |
| VN-1 | 21.62 | 0.035 | 100 | −1.2-0 | Hg/HgO | KOH (1N) | 312.86 | 62.57 |
| VN-1 | 21.62 | 0.073 | 10 | −1.2-0 | Hg/HgO | KOH (1N) | 215.54 | 43.11 |
| VN-1 | 28.46 | 0.321 | 50 | −1.2-0 | Hg/HgO | KOH (1N) | 85.26 | 17.05 |
| VN-2 | 161.74 | 0.625 | 10 | −1.2-0 | Hg/HgO | KOH (1N) | 69.38 | 13.88 |
| VN-2 | 161.74 | 0.404 | 50 | −1.2-0 | Hg/HgO | KOH (1N) | 53.28 | 10.67 |
| VN-5 |  | 0.198 | 10 | −1.2-0 | Hg/HgO | KOH (1N) | 216.63 | 43.33 |
| VN-5 |  | 0.148 | 50 | −1.2-0 | Hg/HgO | KOH (1N) | 197.75 | 39.55 |
| VN-NbN |  | 0.352 | 10 | −1.2-0 | Hg/HgO | KOH (1N) | 47.62 | 9.52 |
| VN-NbN |  | 0.517 | 50 | −1.2-0 | Hg/HgO | KOH (1N) | 31.32 | 6.26 |
| LPCNT |  | 0.008 | 10 | −1.2-0 | Hg/HgO | KOH (1N) | 250.70 | 50.14 |
| VN-LPCNT |  | 0.130 | 10 | −1.2-0 | Hg/HgO | KOH (1N) | 162.35 | 32.47 |
| VN-HPCNT |  | 0.410 | 10 | −1.2-0 | Hg/HgO | KOH (1N) | 237.94 | 47.59 |
| VN-HPCNT |  | 0.322 | 50 | −1.2-0 | Hg/HgO | KOH (1N) | 192.96 | 38.59 |
| VN-battery-1 | 28.46 | 0.281 | 10 | 0.2-3 | Li/Li$^+$ | LiPF$_6$ in EC:DMC (2:1) | 124.14 | 135.18 |

TABLE 2-continued

Specific Capacitances of the VN Materials

| Material | BET Surface area ($m^2/g$) | Loading ($mg/cm^2$) | Scan rate (mV/s) | Voltage window (V) | Reference electrode | Electrolyte | Capacitance (F/g) | Energy density (Wh/kg) |
|---|---|---|---|---|---|---|---|---|
| VN-battery-2 | 21.62 | 0.179 | 10 | 0.02-4 | Li/Li$^+$ | LiPF$_6$ in EC:DMC (2:1) | 180.17 | 396.39 |

Vanadium Nitride/Carbon Nanotube Dispersion

To increase the conductivity of the composite as a supercapacitor material, carbon nanotubes were incorporated with the vanadium nitride product. Multi-walled carbon nanotubes were fabricated through chemical vapor deposition and were dispersed simultaneously with the as-synthesized VN powders in ethanol solution followed by drying. Electrochemical cycling of the VN-CNTs composite containing 10 percent by weight CNTs demonstrated an improved specific capacitance at the scan rate of 100 mv per second as shown in FIG. 1.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention, which is to be given the full breadth of the claims appended hereto and any and all equivalents thereof.

The invention claimed is:

1. A ternary mixed metal transition metal non-oxide nano-particle, electrically conducting composition, comprising:
a ternary mixed transition metal non-oxide-containing component, comprising:
a material selected from the group consisting of nitride, carbide and carbo-nitride; and
at least two different transition metals selected from the group consisting of vanadium, niobium, tungsten, tantalum and molybdenum; and
a ternary mixed transition metal oxide nano-particle component formed on the surface of said ternary mixed transition metal non-oxide-containing component, the ternary mixed transition metal oxide nano-particle component, comprising:
at least two different transition metals selected from the group consisting of vanadium, niobium, tungsten, tantalum and molybdenum,
wherein each of said ternary mixed metal transition metal non-oxide nano-particle, electrically conducting composition and said ternary mixed transition metal non-oxide-containing component contains one of the group consisting of nitride, carbide and carbo-nitride, and
wherein said ternary mixed metal transition metal non-oxide nano-particle, electrically conducting composition is structured to provide charge storage capability.

2. The composition of claim 1, wherein the at least two different metals includes vanadium and at least one metal selected from the group consisting of niobium, tungsten, tantalum and molybdenum.

3. The composition of claim 2, wherein the at least two metals are tungsten and niobium.

4. The composition of claim 1, having a surface area of from 100 $m^2/g$ to 300 $m^2/g$.

5. The composition of claim 1, having an electrical conductivity of from $1\times10^6 \Omega^{-1} m^{-1}$ to $3\times10^6 \Omega^{-1} m^{-2}$.

6. A ternary mixed metal transition metal non-oxide nano-particle composition, comprising:
a precursor which comprises at least one material selected from the group consisting of alkoxides, carboxylates, and halides of transition metals, said material comprising at least two different transition metals selected from the group consisting of vanadium, niobium, tungsten, tantalum and molybdenum,
wherein the precursor further comprises a block copolymer.

* * * * *